(12) United States Patent
Chiu

(10) Patent No.: US 7,009,689 B2
(45) Date of Patent: Mar. 7, 2006

(54) HOLDER OF PHOTOMASK

(75) Inventor: Ming-Chien Chiu, Taipei (TW)

(73) Assignee: Gudeng Precision Industrial Co., Ltd., Taipei Hsien (TW)

( * ) Notice: Subject to any disclaimer, the term of this patent is extended or adjusted under 35 U.S.C. 154(b) by 67 days.

(21) Appl. No.: 10/709,761

(22) Filed: May 26, 2004

(65) Prior Publication Data
US 2005/0007576 A1    Jan. 13, 2005

(30) Foreign Application Priority Data
May 28, 2003   (TW) ................................ 92114456 A

(51) Int. Cl.
G03B 27/62    (2006.01)
B65D 85/30    (2006.01)

(52) U.S. Cl. ......................................... 355/75; 206/454

(58) Field of Classification Search ................. 355/75, 355/53; 206/454, 455; 430/5
See application file for complete search history.

(56) References Cited

U.S. PATENT DOCUMENTS

| | | | | |
|---|---|---|---|---|
| 3,615,006 A | * | 10/1971 | Freed | 206/454 |
| 4,422,547 A | * | 12/1983 | Abe et al. | 206/454 |
| 4,842,136 A | * | 6/1989 | Nakazato et al. | 206/454 |
| 5,314,068 A | * | 5/1994 | Nakazato et al. | 206/454 |
| 5,353,934 A | * | 10/1994 | Yamauchi | 206/454 |
| 5,743,409 A | * | 4/1998 | Nakahara et al. | 206/710 |
| 5,823,736 A | * | 10/1998 | Matsumura | 414/609 |
| 6,216,873 B1 | * | 4/2001 | Fosnight et al. | 206/710 |
| 6,606,145 B1 | * | 8/2003 | Irie et al. | 355/72 |
| 2003/0218728 A1 | * | 11/2003 | del Puerto et al. | 355/51 |
| 2003/0227605 A1 | * | 12/2003 | del Puerto et al. | 355/51 |

* cited by examiner

Primary Examiner—Alan Mathews

(57) ABSTRACT

An apparatus suitable for holding a photomask comprises a photomask holder having a plurality of through holes and a plurality of protrusions detachably connected to the photmask holder via the through holes. The photomask is positioned on supporting ridges of the protrusions so that the friction between the protrusions and the photomask is prevented, and the generation of particulates can be effectively reduced.

5 Claims, 7 Drawing Sheets

HOLDER OF PHOTOMASK

BACKGROUND OF THE INVENTION

1. Field of the Invention

The present invention provides an apparatus comprising a photomask holder for holding a photomask, which is placed in the transfer box and is suitable for photolithography process. The photomask is disposed on the long cambered surface of the protrusion disposed in the photomask holder so that the friction between the protrusions and the Chromium (Cr) deposition formed on the bottom surface of the photomask can be effectively prevented. Thus, generation of particulates can be effectively prevented.

2. Description of the Related Art

Heretofore, a conventional holder 10 of a photomask 201 (as illustrated in FIGS. 1 & 2) is placed in a base 20 of a transfer box. The holder 10 is U-shaped and comprises pluralities of falciform members 101 and protrusions 102. The holder 10 is made of plastic material and is formed as a one-piece structure via injection molding process, and the protrusion 102 is adopted to support the photomask 201. As the surface contact area of the protrusion 102 with the photomask 201 is rather large and since the protrusion 102 is made of a plastic material, the protrusion 102 is not strong enough to resist friction with the photomask 201. Frequently, during inspection, the position of the photomask 201 on holder 10 is adjusted or lifted-off and placed back on the holder 10, and the protrusion 102 will be subjected to friction with the photomask 201 with Chromium (Cr) formed on the bottom surface of the photomask 201, which serves as a circuit protecting shroud layer, and thereby generate particulates. Wherein the Chromium (Cr) deposition on the bottom surface of the photomask 201 is jointed with a jacket membrane 201a to protect the photomask 201 from the dust, which would otherwise adversely affect the focus of the photomask 201. If the surface of the jacket membrane 201a is adhered with a lot of dust or particulates, the jacket membrane 201a must be replaced in order to prevent the wafer from inaccurate exposure. However, the cost of the jacket membrane 201a is high and therefore the overall cost is increased.

FIGS. 1, 2 and 3 respectively, are a perspective view, a front sectional view and a testing waveform chart of the photomask holder. The friction between the protrusion 101 and the photomask 201 would generate particulates, thus the surface of the photomask 201 on the surface of the protrusion 101 is rendered uneven. Thus, it is essential to repeatedly adjust the position of sucking disk to correspond with the photomask 201 to allow the robotic arm uses sucking disk to properly hold and adjust the position of the photomask 201 in the clean room. If the position of the sucking disk of the robotic arm is not adjusted properly, the sucking disk cannot suck the photomask 201 to move. During the inspection process, the protrusion 101 may get seriously damage to produce the particulates generated due to the abrasion of the protrusion 101. And, the testing waveform chart presents some pulsations with big amplitudes and affects the movement of the photomask 201.

Moreover, the transfer box is adopted to protect the photomask 201 from dust in order to ensure that the photomask 201 is clean. Thus, this increases the cost and incurs extra labor attributed to periodic cleansing.

SUMMARY OF THE INVENTION

The present invention has been accomplished under the circumstances in view. The material with high hardness has been tried. Although the material may prevent generation of particulates due to friction, but its brittleness is not adequate. Therefore, the falciform member of the holder through injection molding process or extrusion processis is cracked highly due to shaking of the photomask 201. Besides, its cost is rather expensive. Accordingly, various materials and a variety of structures for protrusion are applied to prevent the protrusion from friction with the photomask and thereby prevent generation particulates as well as reduce the overall cost.

DETAILED DESCRIPTION OF THE PREFERRED EMBODIMENT

Figure 1:
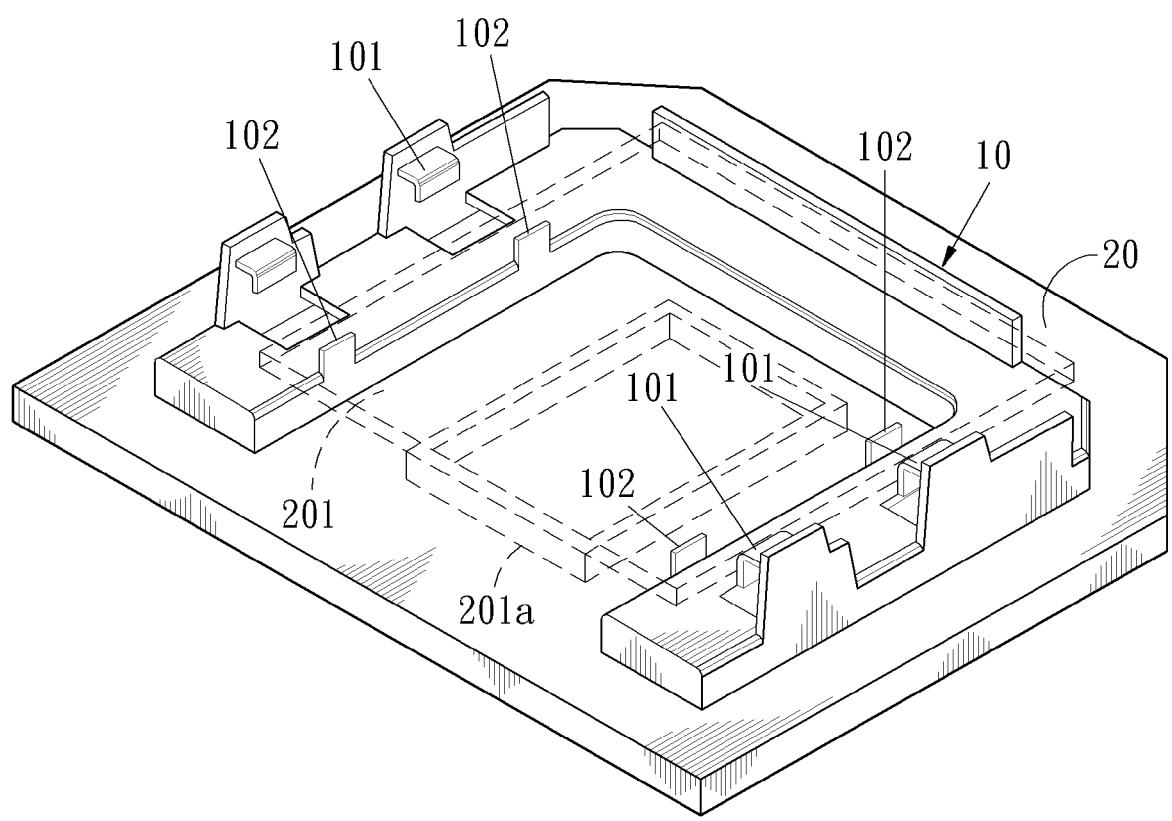
FIG. 1 is a perspective view of a conventional photomask holder with photomask placed thereon.
Figure 2:
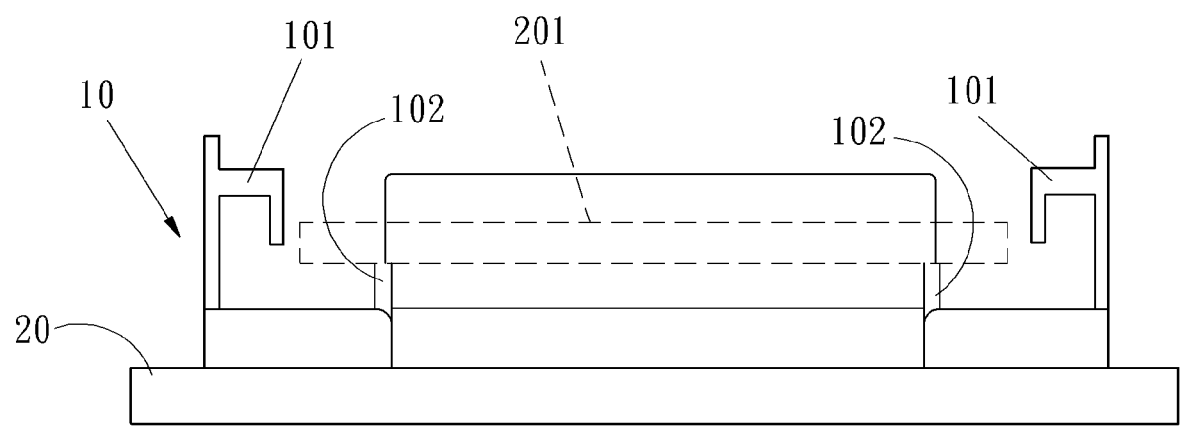
FIG. 2 is a front sectional view of the photomask holder with photomask placed thereon shown in FIG. 1.
Figure 3:
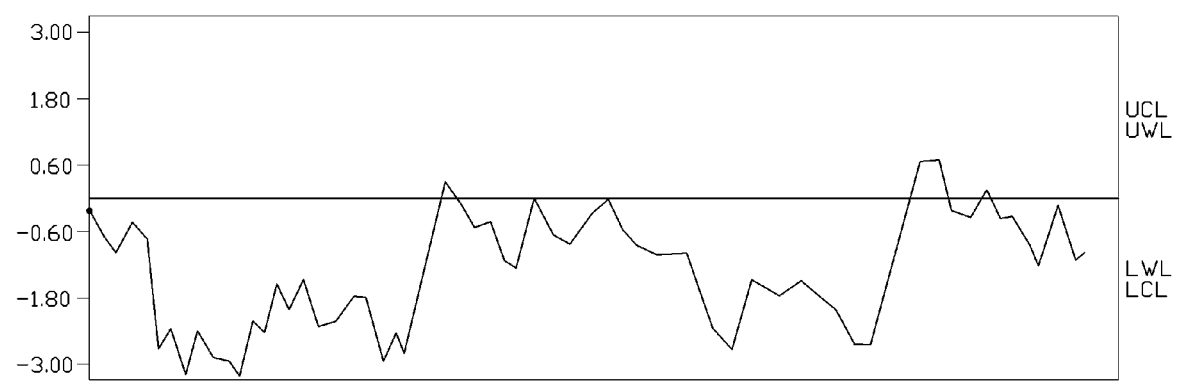
FIG. 3 is a testing waveform chart in balanced mode of the photomask holder according to a conventional art.
Figure 4:
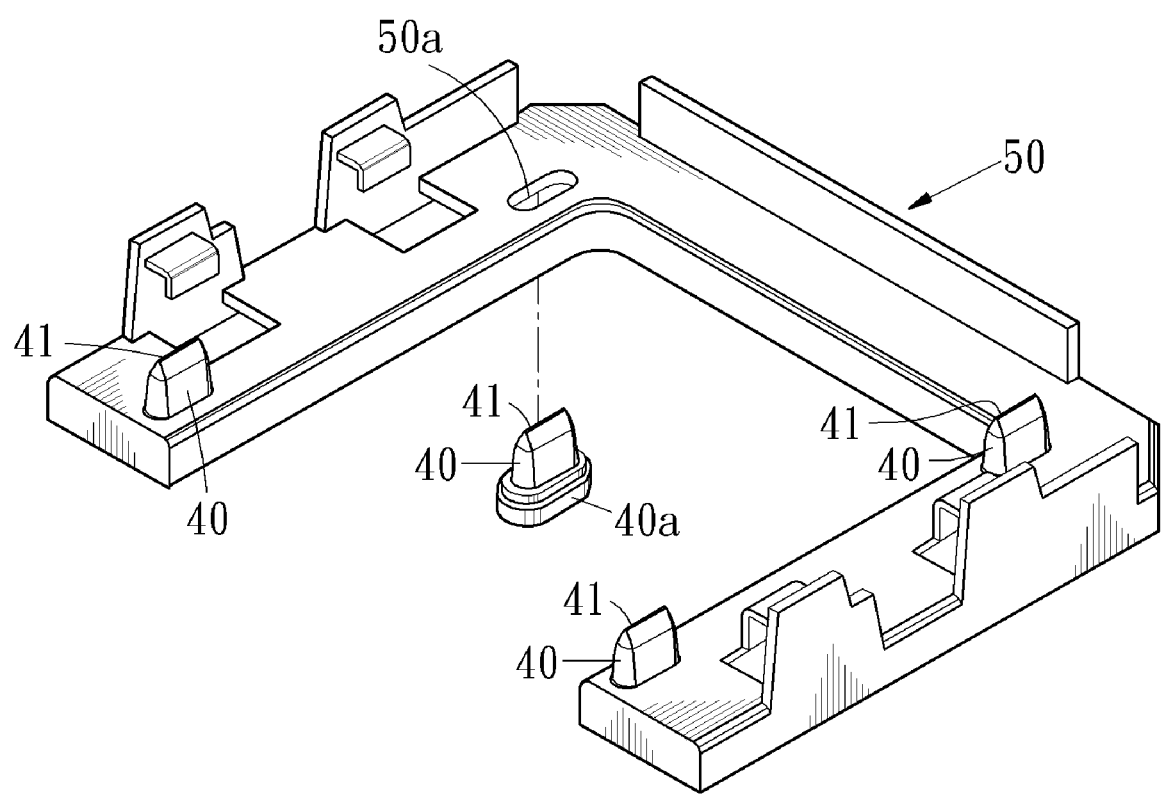
FIG. 4 is a perspective view of a photomask holder according to the present invention.
Figure 5:
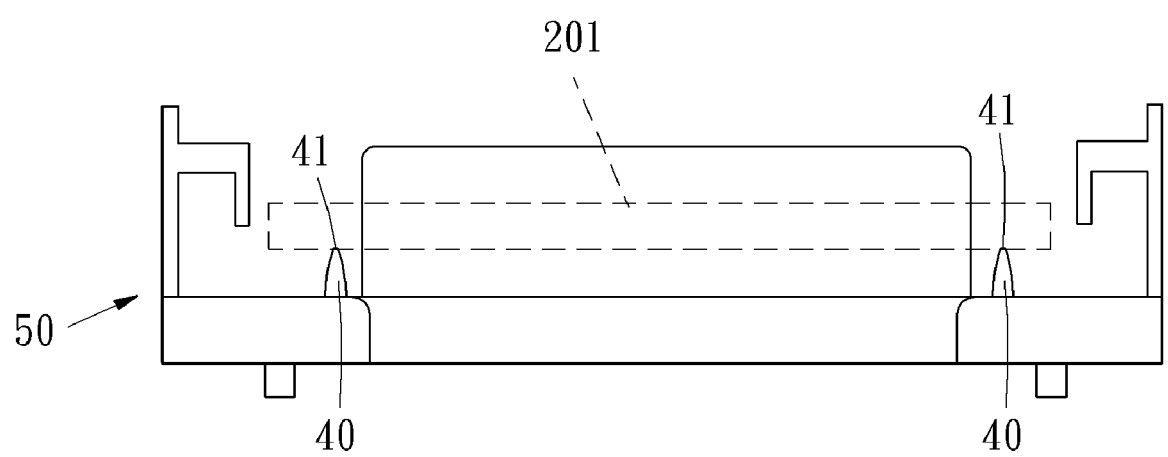
FIG. 5 is a front sectional view of the photomask holder according to the present invention.

FIGS. 4 and 5 are a perspective view and a front sectional view of the photomask holder of the present invention, respectively. A protrusion 40 made of PEEK or VESPEL material having attrition resistance and high hardness is provided. One side of the protrusion 40 is inclined to form a long cambered surface as supporting ridge 41. And, at distal end far away from the supporting ridge 41, a pedestal 40a is disposed to detachably connect with a holder 50 via a through hole 50a of the holder 50 so that the protrusion 40 is positioned on the holder 50 and a photomask 201 can be placed on the supporting ridge 41 of the protrusion 40 thereon. Thus, by means of the supporting ridge 41 with the long cambered surface of the protrusion 40, the photomask 201 is positioned thereon, therefore, the surface contact area between the photomask 201 and the holder 50 is reduced, and the friction there-between is reduced. Moreover, the protrusion 40 with the attrition resistance and high hardness would prevent the protrusion 40 from friction with the Chromium (Cr) deposition formed on the bottom surface of the photomask 201 and generation of particulates can be effectively reduced.

Wherein, the shape of pedestal 40a (refer to FIGS. 4 and 6) at the distal end far away from the supporting ridge 41 on the protrusion 40 can correspond to the structure of the through hole 50a on the holder 50. Or, the protrusion 40 can also be constructed without pedestal 40a and directly adhered to the protrusions 40 on the surface of the holder 50.

Figure 6:
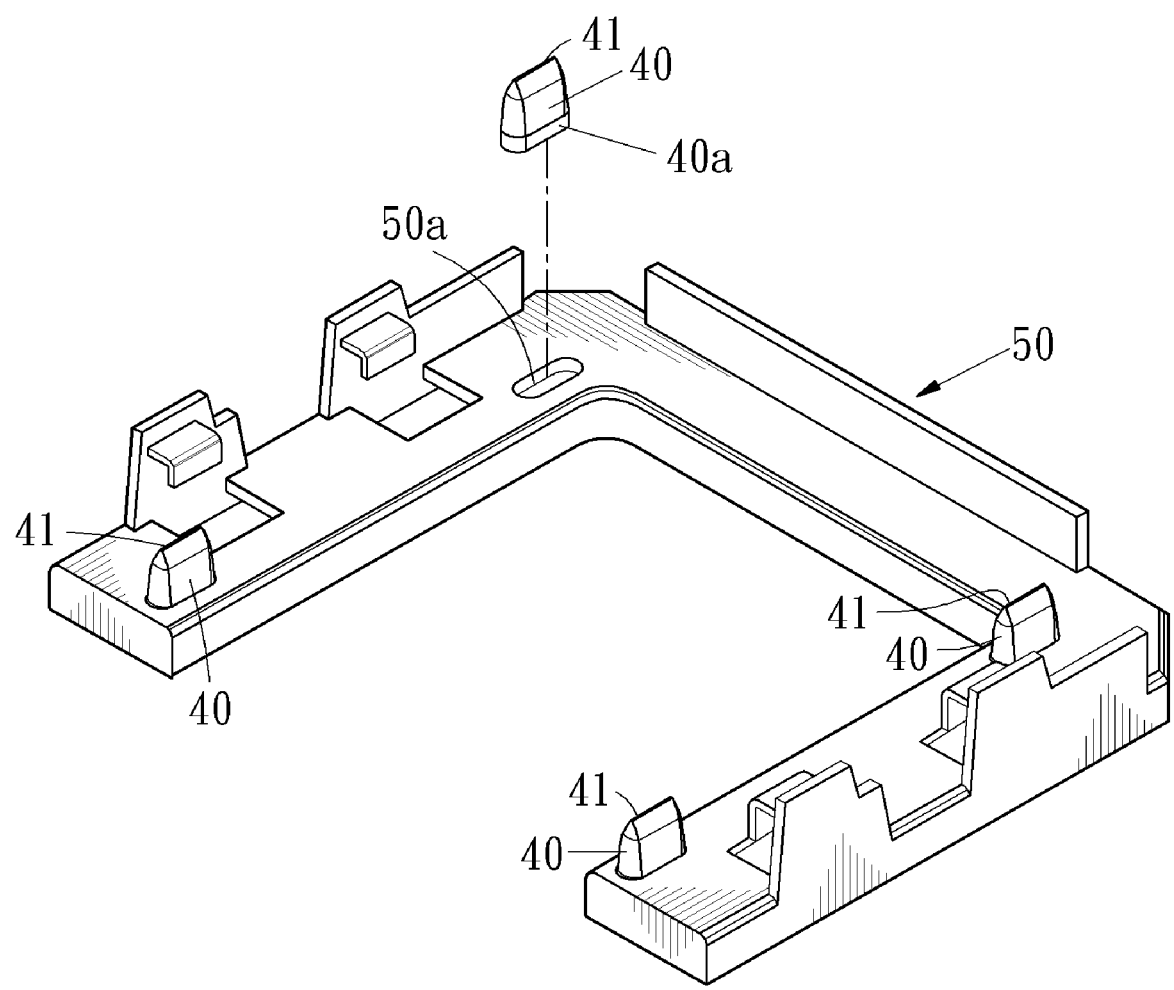
FIG. 6 is an exploded perspective view of the photomask holder according to the preferred embodiment of the present invention.
Figure 7:
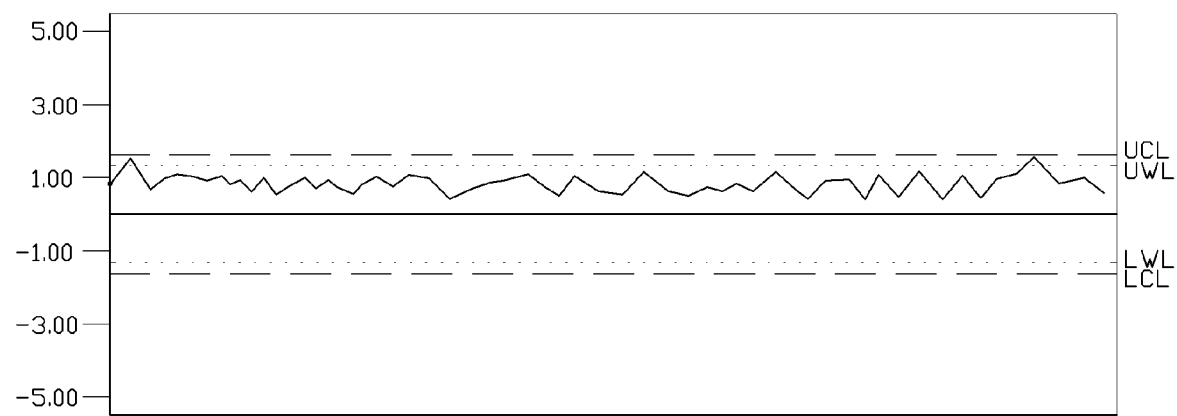
FIG. 7 is a testing waveform chart in balanced mode of the photomask holder of the present invention.

FIGS. 5, 6 and 7, are a frontal sectional view, an exploded perspective view and a testing waveform chart in balanced mode of the photomask holder of the present invention, respectively. The protrusion 40 made of material with attrition resistance and high hardness is provided. And, by means of the supporting ridge 41 with the long cambered surface of the protrusion 40, the photomask 201 is positioned thereon. Thus, the protrusion 40 can be prevented from friction with the bottom side of the photomask 201 and generation of particulates can be effectively reduced. Furthermore, the supporting ridge 41 of the protrusion 40 is made of hard material and is capable of properly positioning the photomask 201 on the protrusion 40. Thus, it is not necessary to repeated adjust the position of sucking disk to correspond with the photomask 201 to facilitate the robotic arm to move the photomask 201 in clean room. And, the testing waveform charts of photomask 201 present pulsations with small amplitudes reflecting a balanced and stable condition within tolerance limit. Thus, it proves that the protrusion 40 is capable of preventing generation of particulates. Additionally, the protrusion 40 is also capable of stably supporting and positioning the photomask 201 to facilitate the robotic arm to move the photomask 201.

Therefore, the protrusion 40 on the holder 50 of the present invention is capable of stably supporting photomask 201, as well as prevents the protrusion 40 from generating particulates due to friction.

Although a particular embodiment of the invention has described in detail for purpose of illustration, various modifications and enhancements may be made without departing from the spirit and scope of the invention. Accordingly, the invention is not to be limited except as by the appended claims.

The invention claimed is:

1. An apparatus suitable for holding a photomask, comprising:
   a photomask holder, having a plurality of through holes; and
   a plurality of protrusions, wherein each protrusion is comprised of a PEEK or VESPEL material and one side thereof is inclined to form a cambered surface to serve as a supporting ridge, wherein the protrusions are inserted into the through holes of the photomask holder, and wherein a photomask is disposed on the supporting ridges so that a surface contact area and friction between the supporting ridges and chromium deposition formed at a bottom surface of the photomask are substantially reduced so that generation of particulates due to friction between the protrusions and a chromium deposition formed at a bottom surface of the photomask is substantially reduced.

2. The apparatus as claimed in claim 1, wherein a pedestal formed far away from each supporting ridge is detachably integrated into the through holes of the photomask holder.

3. The apparatus as claimed in claim 2, wherein the shape of the pedestal corresponds to the structure of the through holes of the photomask holder.

4. An apparatus suitable for holding a photomask, comprising:
   a photomask holder, having a plurality of through holes;
   a plurality of protrusions, each with a cambered surface supporting ridge formed at one end thereof, detachably integrated with the photomask holder via the through holes, wherein a photomask is positioned on the supporting ridges; and
   a pedestal, formed far away from each supporting ridge, detachably integrated into the through holes of the photomask holder.

5. The apparatus as claimed in claim 4, wherein a shape of a pedestal formed far away from each supporting ridge corresponds to the through holes of the photomask holder.

* * * * *